United States Patent
Bivona et al.

[11] Patent Number: 5,990,418
[45] Date of Patent: Nov. 23, 1999

[54] HERMETIC CBGA/CCGA STRUCTURE WITH THERMAL PASTE COOLING

[75] Inventors: Kevin G. Bivona, Poughkeepsie; Jeffrey T. Coffin, Pleasant Valley; Stephen S. Drofitz, Jr., Wappingers Falls; Lewis S. Goldmann, Bedford; Mario J. Interrante, New Paltz; Sushumna Iruvanti, Wappingers Falls; Raed A. Sherif, Croton-on Hudson, all of N.Y.

[73] Assignee: International Business Machines Corporation, Armonk, N.Y.

[21] Appl. No.: 08/902,556

[22] Filed: Jul. 29, 1997

[51] Int. Cl.$^6$ .................................................. H01L 23/02
[52] U.S. Cl. ......................... 174/52.4; 257/713; 257/778
[58] Field of Search ..................... 361/704, 718, 361/719; 257/704, 778, 712, 713, 710; 174/52.3, 52.4

[56] References Cited

U.S. PATENT DOCUMENTS

| | | | |
|---|---|---|---|
| 4,514,752 | 4/1985 | Engel et al. | 174/52.5 |
| 4,985,753 | 1/1991 | Fujioka et al. | 257/700 |
| 5,014,115 | 5/1991 | Moser | 257/659 |
| 5,132,875 | 7/1992 | Plesinger | 361/704 |
| 5,268,533 | 12/1993 | Kovacs et al. | 174/52.4 |
| 5,297,006 | 3/1994 | Mizukoshi | 361/704 |
| 5,317,107 | 5/1994 | Osorio | 174/52.4 |
| 5,323,294 | 6/1994 | Layton et al. | 361/699 |
| 5,324,888 | 6/1994 | Tyler et al. | 174/52.2 |
| 5,357,673 | 10/1994 | Polak et al. | 29/840 |
| 5,365,402 | 11/1994 | Hatada et al. | 361/699 |
| 5,414,214 | 5/1995 | Cho et al. | 174/52.3 |
| 5,455,457 | 10/1995 | Kurokawa | 257/712 |
| 5,471,366 | 11/1995 | Ozawa | 361/704 |
| 5,528,456 | 6/1996 | Takahashi | 361/704 |
| 5,539,151 | 7/1996 | Hamzehdoost et al. | 174/52.4 |
| 5,706,579 | 1/1998 | Ross | 29/840 |
| 5,745,344 | 4/1998 | Baska et al. | 361/705 |

OTHER PUBLICATIONS

A.J. Blodgett et al., "Thermal Conduction Module: A High–Performance Multilayer Cermaic Package", IBM J. Res. Develop., vol. 26, No. 1, pp. 30–36, (Jan. 1982).

R.G. Biskeborn et al., "Integral Cap Heat Sink Assembly For The IBM 4381 Processor", Proceedings of the Technical Conference, Fourth Annual International Electronics Packaging Conference, pp. 468–474, (Oct. 29–31, 1984).

*Primary Examiner*—Dean A. Reichard
*Assistant Examiner*—Hung V Ngo
*Attorney, Agent, or Firm*—Ratner & Prestia; Tiffany L. Townsend

[57] ABSTRACT

A device and method for hermetically sealing an integrated circuit chip between a substrate and a lid while providing effective dissipation of heat generated by the integrated circuit chip. The device includes an integrated circuit chip, carrier substrate, interface coolant, and a lid. The integrated circuit chip is attached to the top of the carrier substrate. The interface coolant is disposed on the top of the integrated circuit chip and the lid is placed on top of the carrier substrate/integrated circuit chip combination and contacts the interface coolant. The interface coolant provides a thermal path for conducting heat from the integrated circuit chip to the lid. The substrate is attached to a circuit board by a ceramic ball grid array (CBGA) or a ceramic column grid array (CCGA).

19 Claims, 7 Drawing Sheets

HERMETIC CBGA/CCGA STRUCTURE WITH THERMAL PASTE COOLING

FIELD OF THE INVENTION

This invention relates generally to semiconductor packages. In particular, it relates to an hermetically sealed ceramic ball grid array (CBGA) or ceramic column grid array (CCGA) structure and a method of hermetically sealing to package flip-chip semiconductor devices. Interface coolant is mounted between the devices and the module lid of the semiconductor package for an efficient heat removal mechanism.

BACKGROUND OF THE INVENTION

Hermetic sealing is important for many microelectronic devices requiring protection from ambient conditions such as humidity, contamination, and the like. Hermeticity enhances overall device reliability. Further, for flip chip packages, hermeticity enhances the fatigue life of the device-to-substrate interconnections. Without hermeticity, flip chip packages with large chips (for example, >10 mm sq.) would require a polymer encapsulant underneath the device for enhanced interconnection fatigue life. Such encapsulant, however, renders the package non-reworkable.

There are a few ways to achieve hermeticity. One conventional method is to mechanically seal a metal lid (e.g. Al or Cu) to the substrate via a C-ring as illustrated in FIG. 9. In FIG. 9, integrated circuit chip 912 is bonded to substrate 900. Piston 910 contacts the surface of each integrated circuit chip 912 and conducts heat away from integrated circuit chip 912 to housing 904. Cold plate 906 is attached to the top of housing 904 and conducts heat from housing 904 by using water (or other coolant) injected into port 914. C-ring 902 seals substrate 900 between base plate 908 and housing 904. This design, introduced by International Business Machines Corporation in the early 1980's, is referred to as a thermal conduction module (TCM) and is described in *Thermal Conduction Module: A High-Performance Multilayer Ceramic Package*, by A. J. Blodgett and D. R. Barbour, IBM J. Res. Develop., Vol. 26, No. 1, January 1982, and is incorporated herein by reference. Due to its complexity, the TCM is typically used for high-performance, large-size, multi-chip modules (MCM's).

Another method of hermetic sealing involves soldering the lid to the substrate. This requires a matched coefficient of thermal expansion (CTE) between the lid and the substrate to reduce solder cracking during thermal cycling. For this purpose, the lid material is typically made of ceramic to match the CTE of the ceramic substrate.

A third method used to achieve hermeticity uses a seam sealing technique, where a lid is brazed to the substrate via localized resistance heating. Conventional packaging techniques for such devices (e.g., seam welding of metallic lids to flat packages or flatpacks) often require labor-intensive manual procedures which do not lend themselves to automated production techniques. It has been especially uneconomical and impractical to provide automated mass production techniques for localized heating to the seal area itself without heating the package and the device contained in the package.

When using solder sealing techniques, the whole assembly is placed into an oven where temperatures must exceed the melting temperature of the solder material to ensure complete solder wetting. For eutectic lead-tin solder, having a melting temperature of 180° C., the module is subjected to temperatures around 220–240° C. for a few minutes. Obviously, solders with higher melting temperatures (e.g., gold-tin alloys) are more likely to induce damage to interface coolant and controlled collapse chip connections (C4) during the sealing process. In addition, high temperature alloys, such as gold-tin alloys, are not cost effective.

Microelectronic circuits incorporating ceramic substrates are often enclosed within an hermetically sealed package or housing that provides support and protection for the circuit. A number of electronic components and interconnecting metallizations are attached to a substrate. The packages are hermetically sealed by a cover or lid over the substrate that surround the chips. The material most commonly used for both the housing or lid is a Kovar® alloy manufactured by the General Electric Company, with a composition of 53% iron, 29% nickel, and 18% cobalt; an optional gold or nickel plating may be added to prevent corrosion. The lids are welded or soldered to the upper surface of the package, thereby hermetically sealing the packages.

Conventional lids are typically formed as simple flat plates, or in "hat-shaped" configurations in which the lid is elevated above the upper edges of the package. The lid cannot be too thin because the lid must be able to withstand substantial loading. Heavy loading is encountered particularly before shipment, when the assembled circuit packages are tested to confirm the hermeticity of the seal. One such test is the helium leak test. During this test, the package is subjected to a significant pressure that can cause the lid to deflect downward toward the interior circuitry which it is designed to protect. An excessive downward deflection can cause shorting, damage to the electrical components, or both and can also induce an excess stress in the weld seals that results in seal failure and reduces the overall rigidity of the structure. The lid is also affected by the stress encountered during thermal cycling of the structure.

One way to strengthen the lid is to make it thicker. This solution increases both the package weight, however, and the overall size of the lid. In addition, the thermal performance of the lid degrades severely due to the very poor thermal conductivity of the Kovar® material. Another approach is to increase the height of the package to maintain the necessary clearance above the electrical components and circuit traces under maximum lid depression. This solution adds undesirable volume to the package, however, exceeding the volume needed for the actual circuitry, and may violate height restrictions.

It is known that an integrated circuit chip generates heat while the chip is operating. Thus, the problem arises of how to prevent the temperature of the chip from exceeding a certain maximum level at which the chip begins to degrade in reliability or performance.

Heat removal from semiconductor devices is required for both device functionality and reliability. For wire bond packages, the devices are typically bonded to the substrate with thermal adhesives. The primary heat transfer path for this type of package is through the substrate which, in general, is a poor heat conductor. For flip chip packages, however, there are two parallel paths for heat removal from the devices. One path is from the device to the substrate through the solder interconnections; the other path is from the back of the chip to the module lid. A heat transfer medium may also be disposed between the back of the chip and the lid to enhance heat conduction or heat transfer between the chip and the lid. One such heat transfer medium is a thermal paste.

U.S. Pat. No. 5,323,294 issued to Layton et al. discloses a compliant body with microscopic voids containing a liquid metal alloy. As shown in FIG. 10, compliant body 1006 containing a liquid metal alloy is pressed between integrated circuit chip 1002 and lid 1004 with heatsink 1014. Integrated circuit chip 1002 is attached to substrate 1000, having interconnect pins 1012, by chip terminals 1008. Lid 1004 is attached to substrate 1000 by lid bond 1110. This device does not seam seal integrated circuit chip 1002. In addition, integrated circuit chip 1002 and lid 1004 are subject to deterioration and attack due to the liquid metal alloy reacting with integrated circuit chip 1002 and lid 1004.

U.S. Pat. No. 5,414,214 issued to Cho et al. discloses a device which selectively heats the seal area of an encapsulating package by providing a built-in resistive heater circuit in the substrate or the lid to melt and form a seal around a wirebond circuit. This device requires valuable substrate surface area to form the seal and does not provide a mechanism to cool the integrated circuit chip.

Conventional wire bond packages typically provide lower interconnection density between the devices and substrate as compared to the flip chip technology. Thus, wire bond packages are not preferable and typically do not allow for high-power, high-performance devices.

SUMMARY OF THE INVENTION

To solve these aforementioned disadvantages of conventional hermetically sealed integrated circuits, the present invention relates to an apparatus and method for hermetically sealing an integrated circuit chip between a substrate and a lid while providing effective dissipation of heat generated by the integrated circuit chip. The apparatus comprises an integrated circuit chip, carrier substrate, interface coolant, and a lid. The integrated circuit chip is attached to the top of the carrier substrate. The interface coolant is disposed on the top of the integrated circuit chip and the lid is placed on top of the carrier substrate/integrated circuit chip combination and contacts the interface coolant. The interface coolant provides a thermal path for conducting heat from the integrated circuit chip to the lid.

The present invention also relates to an apparatus for hermetically sealing an integrated circuit chip and providing heat dissipation for the integrated circuit chip, where the lid is prevented from collapsing by using a standoff to support the lid above the carrier substrate.

The present invention further relates to an apparatus for hermetically sealing an integrated circuit chip and providing heat dissipation for the integrated circuit chip, where the standoff used to support the lid surrounds the integrated circuit chip.

The present invention relates still further to an apparatus for hermetically sealing an integrated circuit chip and providing heat dissipation for the integrated circuit chip, where the substrate is a ceramic substrate.

The present invention also relates to an apparatus for hermetically sealing an integrated circuit chip and providing heat dissipation for the integrated circuit chip, where the lid is attached to the substrate by brazing the lid to the substrate before the substrate is attached to a circuit board.

The present invention relates still further to an apparatus for hermetically sealing an integrated circuit chip and providing heat dissipation for the integrated circuit chip, where a heat sink is attached to the surface of the lid to better dissipate the heat conducted through the interface coolant to the lid.

The present invention also relates to a method for hermetically sealing an integrated circuit chip and providing heat dissipation for the integrated circuit chip comprising the steps of attaching a bottom surface of the integrated circuit chip to the top surface of a carrier substrate, placing a interface coolant in contact with the top surface of the integrated circuit chip, disposing a lid above the integrated circuit chip and in contact with the interface coolant, attaching the lid to the top surface of the carrier substrate, hermetically sealing the integrated circuit chip between the carrier substrate and the lid, and coupling the bottom of the carrier substrate to the circuit card.

The present invention still further relates to a method for hermetically sealing an integrated circuit chip and providing heat dissipation for the integrated circuit chip, where the lid is attached to the substrate by brazing the lid to the substrate.

The present invention finally relates to a method for hermetically sealing an integrated circuit chip and providing heat dissipation for the integrated circuit chip, where the carrier substrate is coupled to the circuit card by using a ceramic ball grid array (CBGA) or a ceramic column grid array (CCGA).

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE PREFERRED EMBODIMENTS

Figure 1:
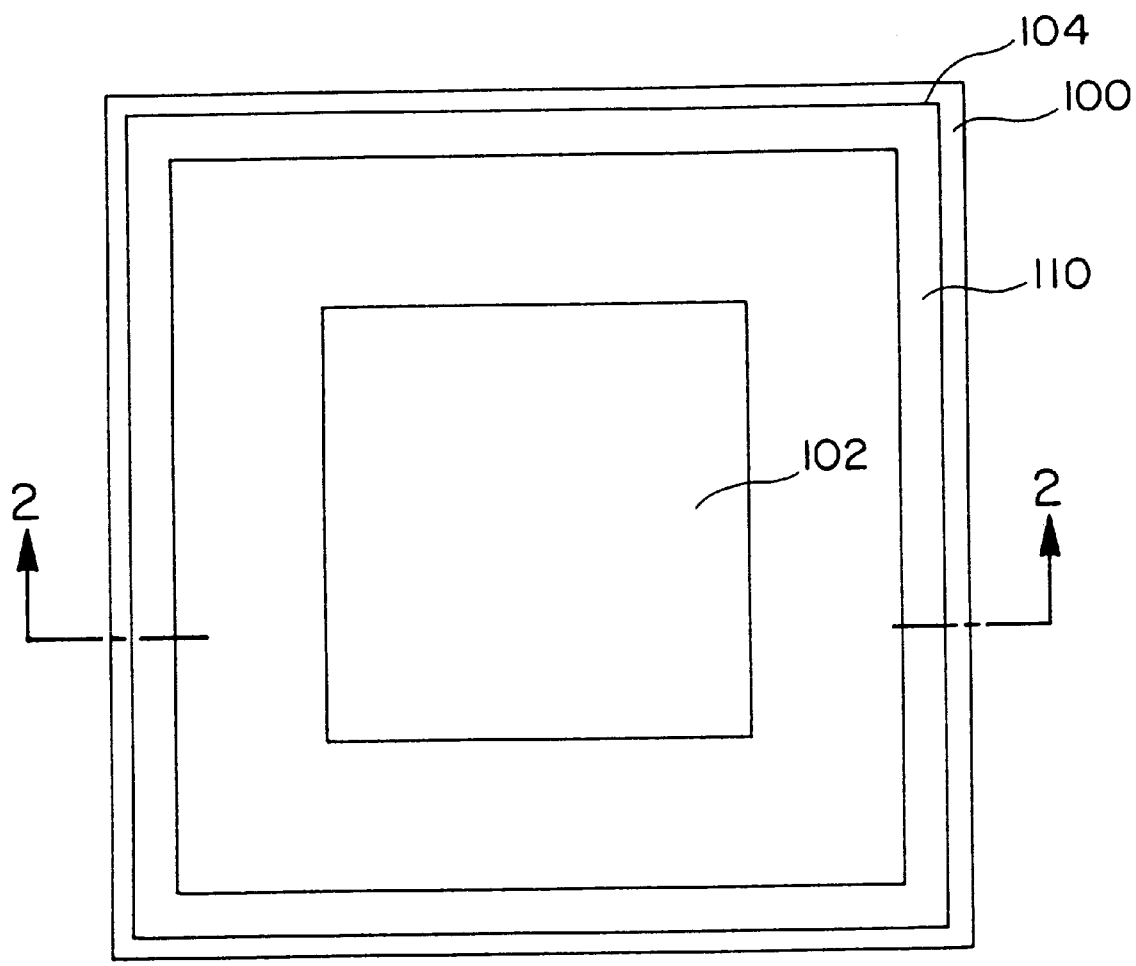
FIG. 1 is a plan view of an exemplary embodiment of the present invention.

Flip chip interconnection technology with ceramic substrates allows high-power, high-performance devices to be used. It is generally desirable to utilize the large number of chip-to-substrate interconnections by also increasing the number of I/O's between the substrate and next level assembly. This can be done by using ball grid array (BGA) or column grid array (CGA) between the substrate and the card instead of the more traditional pin grid array (PGA). The higher I/O density offered by BGA or CGA allows use of a large number of I/O without increasing the size of the substrate.

We have seen above why a flip chip package would require hermeticity, why it would benefit from CBGA/

CCGA connections between the substrate and card, and why it would require interface paste cooling. The problem is the inherent incompatibility, however, between hermeticity, CBGA/CCGA, and interface paste cooling.

The second heat conduction path discussed above can be made more efficient by using an interface paste between the back of the device and the module lid. Using this approach, over 90% of the heat goes through the module lid. The use of interface paste therefore greatly enhances the heat conduction mechanism from the back of flip chip devices to the module lid.

Whenever an thermal paste is used, care must be taken in designing the lid to ensure that the interface paste remains in the gap between the devices and the lid during module operation. Specifically, it has been found that thermally induced deflections of the lid and substrate tend to push the paste out of its original location during thermal cycling. This mechanism is more pronounced with less rigid designs, i.e., when the lid or substrate is very thin. Further, thermal paste should not be exposed to very high temperatures for extended periods of time because such exposure may lead to degradation of the interface coolant and deterioration of its thermal conduction capability.

The CBGA/CCGA (where the balls and columns are made of 90Pb-10Sn alloy) are attached to the substrate and card via Pb—Sn eutectic solder. Hence, it is apparent that the attach process of the CBGA/CCGA to the substrate and card is likely to melt the eutectic solder used in sealing the module. This could render the module non-hermetic. Further, because the card cannot be subjected to the pressure associated with the helium leak test, the potential loss of module hermeticity during the card attach process cannot be detected, and hence cannot be corrected.

The net of the above discussion indicates that CBGA/CCGA cannot be attached to a high-performance/high-powered Pb—Sn eutectic solder-sealed module. This leaves the only way to combine CBGA/CCGA with an hermetic module is to use seam sealing techniques. Indeed, the CBGA/CCGA attach process and seam sealing are compatible. The problem associated with such a structure is the requirement of interface paste stability. Specifically, the Kovar® lid, which is very thin, can experience large deflections during thermal cycling.

Referring to FIG. 1, a top view of an exemplary embodiment of the present invention shows integrated circuit chip 102 placed on carrier substrate 100 and covered by lid 104. Lid 104 is attached to carrier substrate 100 by an hermetic seal 110.

Figure 2:
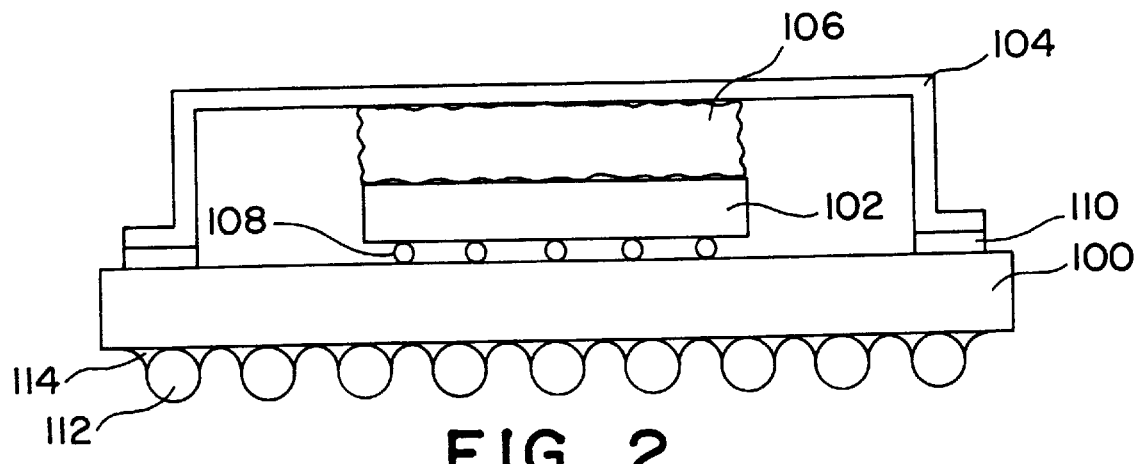
FIG. 2 is a sectional view of the exemplary embodiment of FIG. 1 through section 2—2.

Referring to FIG. 2, a partial sectional view of the first exemplary embodiment is shown. In FIG. 2, integrated circuit chip 102 is attached to carrier substrate 100 by mounting balls 108, such as a controlled collapse chip connection (C4), for example. Interface coolant 106, such as thermal paste, is disposed on integrated circuit chip 102 to provide a thermal conduction path for heat generated by integrated circuit chip 102. Carrier substrate 100 is attached to a circuit board (not shown) by connectors 112, such as CBGA or CCGA, and eutectic solder 114. Lid 104 is placed on top of carrier substrate 100 and contacts interface coolant 106 completing the thermal conduction path from integrated circuit chip 102 to lid 104. Lid 104 may be made of metal or metal alloy, such as Kovar®. Integrated circuit chip 102 is hermetically sealed between lid 104 and carrier substrate 100 by sealing lid 104 to carrier substrate 100 using hermetic seal 110, such as a seam seal or brazing. Brazing uses localized high temperature and pressure to seal lid 104 to carrier substrate 100 along the edges of lid 104 without affecting mounting balls 108, eutectic solder 114, or connectors 112.

The thickness of lid 104 depends on the material used. For example, in the case of Kovar®, a thickness ranging from 0.127 mm to 0.508 mm (0.005 in. to 0.020 in.) is preferred for optimal heat dissipation. In addition, the thickness of interface coolant 106 affects conduction of heat from integrated circuit chip 102 and depends on the material used. For example, if thermal paste is used as interface coolant 106, a thickness ranging between 0.076 mm and 0.381 mm (0.003 in. to 0.015 in.) is preferred for optimal heat dissipation.

Figure 3:
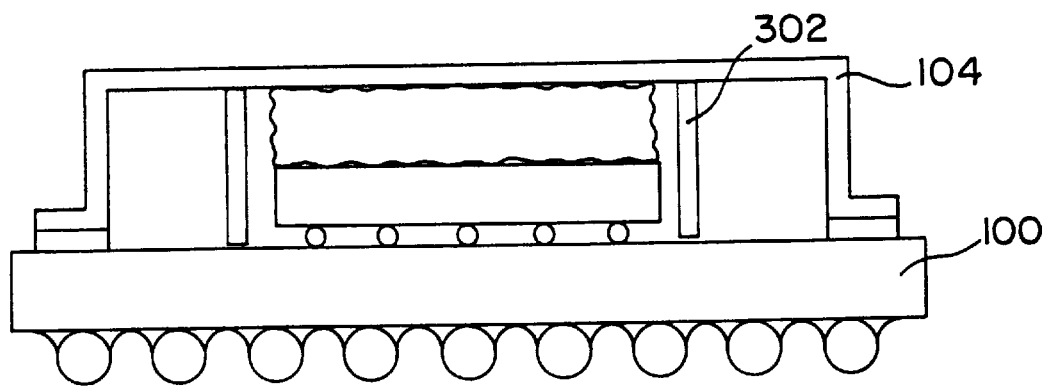
FIG. 3 is a side view of a second exemplary embodiment of the present invention.

Referring to FIG. 3, a side view of a second exemplary embodiment of the present invention is shown. In FIG. 3, standoff 302 is added between carrier substrate 100 and lid 104. The purpose of standoff 302 is to minimize deflection of lid 104. Deflection of lid 104 may be due, for example, to external mechanical forces or thermal expansion/contraction. Thermal or mechanical deflection tends to squeeze interface coolant 106 out of the gap between integrated circuit chip 102 and lid 104. Thereby affecting the thermal performance and reliability of the device. Furthermore, minimizing contraction of lid 104 protects integrated circuit chip 102 from mechanical damage and assures proper contact between interface coolant 106 and lid 104, thereby maintaining thermal conduction of heat from integrated circuit chip 102.

Figure 4:
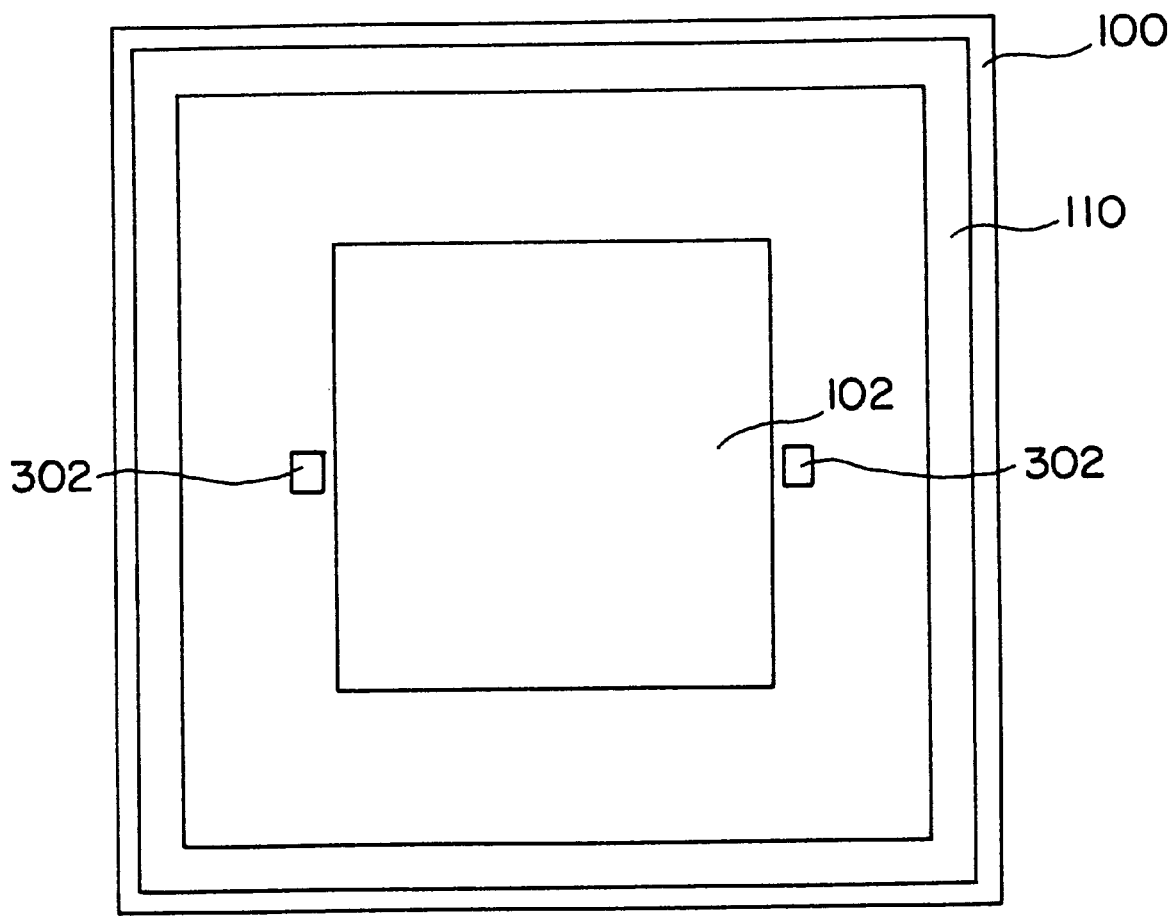
FIG. 4 is a plan view of the exemplary embodiment of FIG. 3.

Referring to FIG. 4, standoffs 302 are shown as disposed on opposite sides of integrated circuit chip 102. This embodiment is not limited, however, to this configuration. Any number of standoffs 302 may be used, such as 1, 3, 4, or more. Furthermore, standoffs 302 may be placed along the sides or corners of integrated circuit chip 102, or at any other location depending on the particular requirement.

Figure 5:
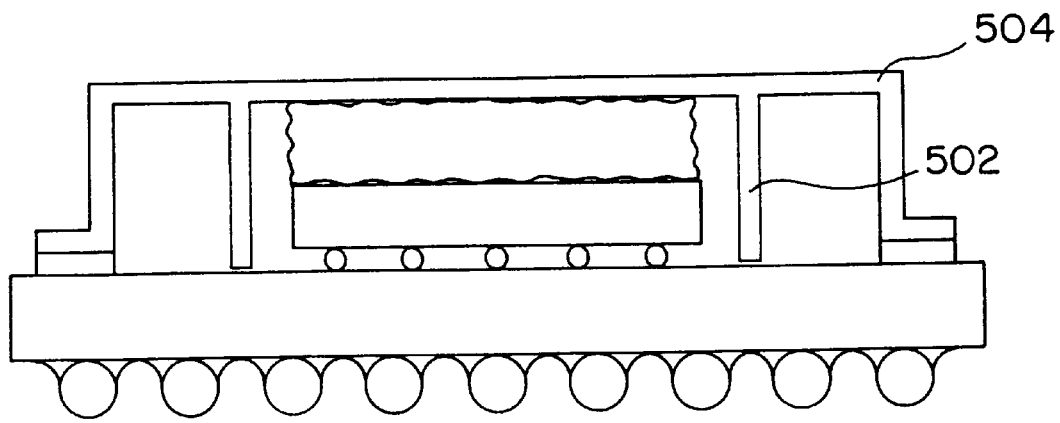
FIG. 5 is a side view of a third exemplary embodiment of the present invention.

Referring to FIG. 5, a third exemplary embodiment of the present invention is shown. In FIG. 5, lid 504 is formed to include integrated standoff 502. Integrated standoff 502 provides the same function as standoff 302. Fewer parts are needed, however, and assembly of the device is simpler.

Figure 6:
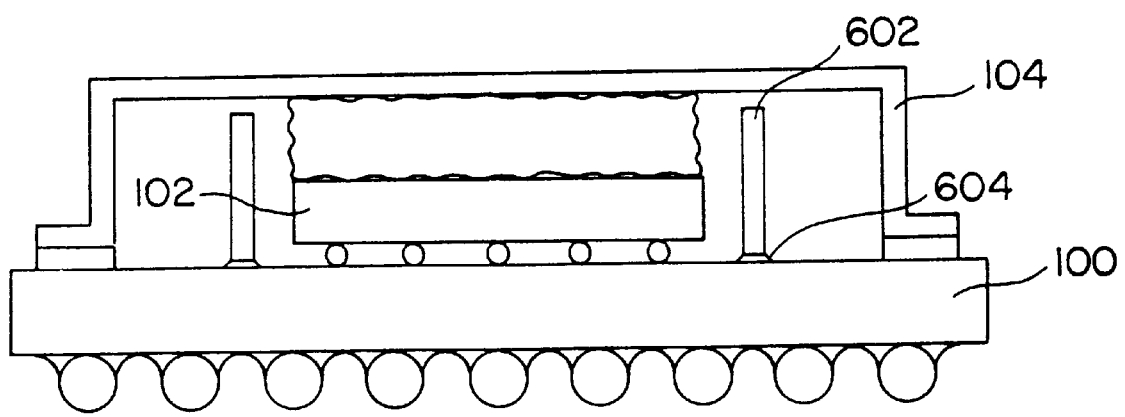
FIG. 6 is a side view of a fourth exemplary embodiment of the present invention.

Referring to FIG. 6, a fourth exemplary embodiment of the present invention is shown. In FIG. 6, shortened standoff 602 is bonded to carrier substrate 100 by bond 604, such as epoxy. Shortened standoff 602 does not contact the underside of lid 104 and allows lid 104 to deflect toward integrated circuit chip 102 before shortened standoff 602 comes into contact with lid 104. In this way, a small amount of play may be built into lid 104 to prevent excessive downward forces on carrier substrate 100 thereby preventing mechanical stress on carrier substrate 100.

Figure 7:
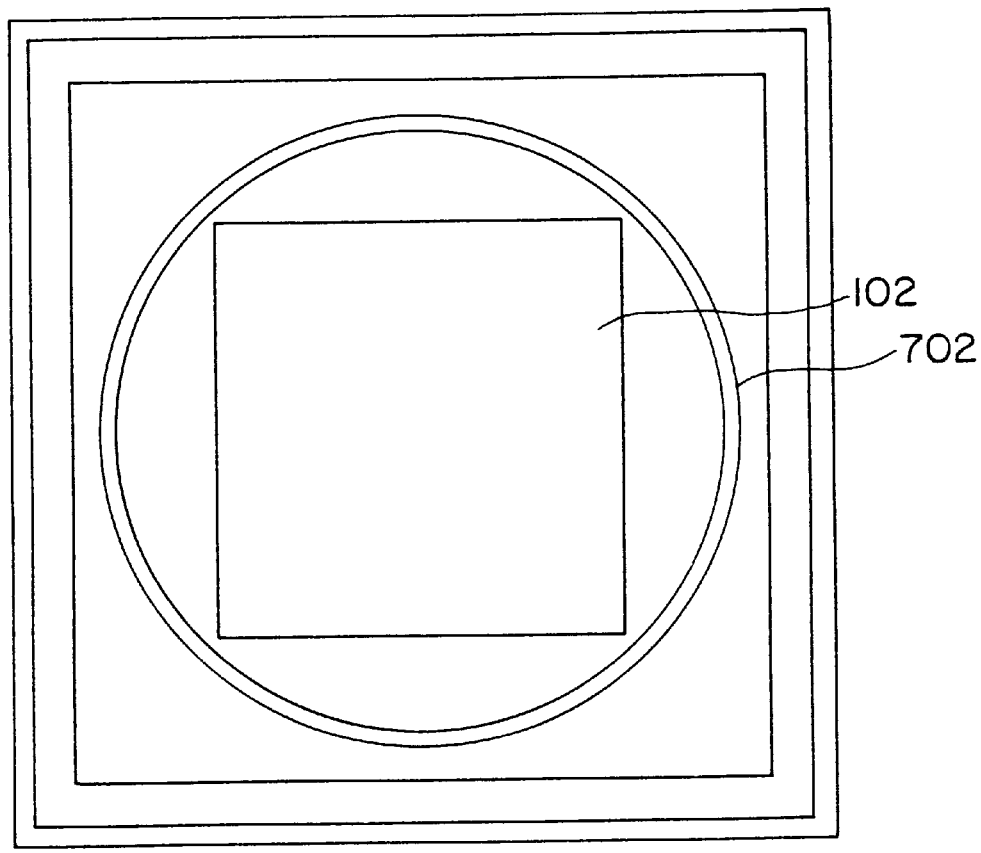
FIG. 7 is a plan view of a fifth exemplary embodiment of the present invention.

Referring to FIG. 7, a fifth exemplary embodiment of the present invention is shown. In FIG. 7, circular standoff 702 is placed around integrated circuit chip 102. Circular standoff 702 may be a separate part or integrated with lid 104. Further, circular standoff 702 may be attached to either lid 104, carrier substrate 100, or may float (not attached to either lid 104 or carrier substrate 100). Circular standoff 702 may be made of plastic, resin, ceramic, metal or any compatible material. Circular standoff 702 is not limited to having a circular shape, however, and my be a square, a rectangle or any other shape, for example.

Figure 8:
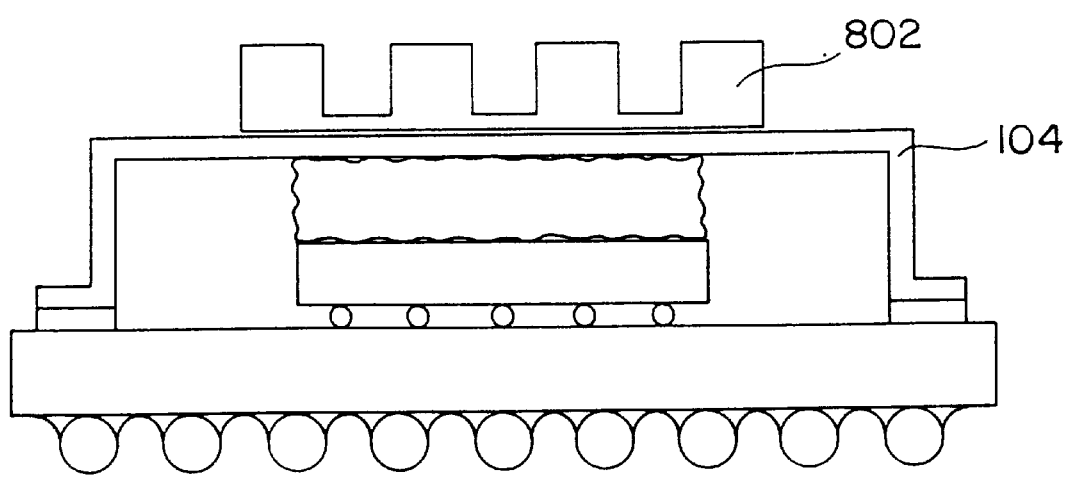
FIG. 8 is a side view of a sixth exemplary embodiment of the present invention.
Figure 9:
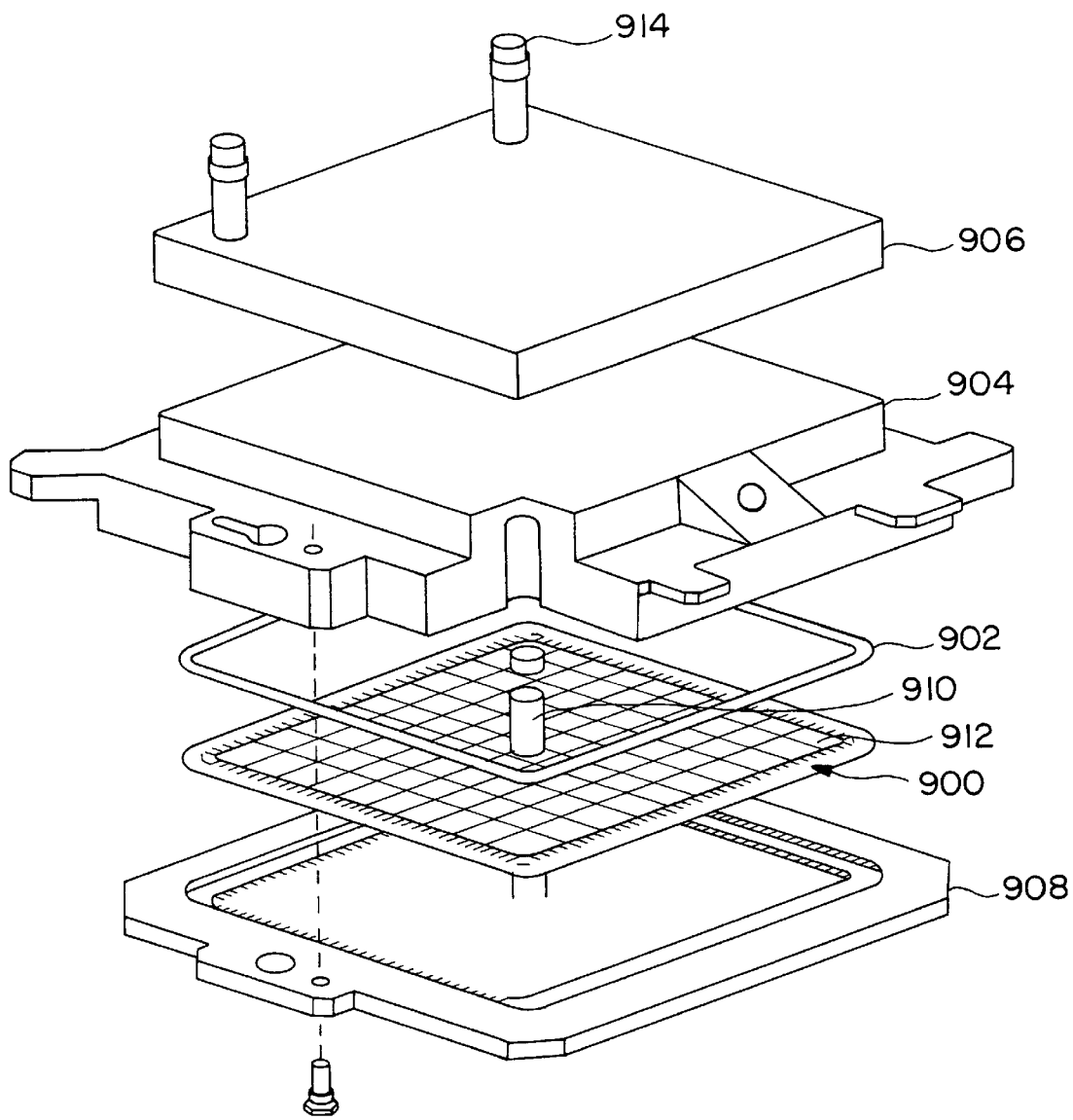
FIG. 9 is a perspective view of a prior art integrated circuit chip heat dissipation system.
Figure 10:
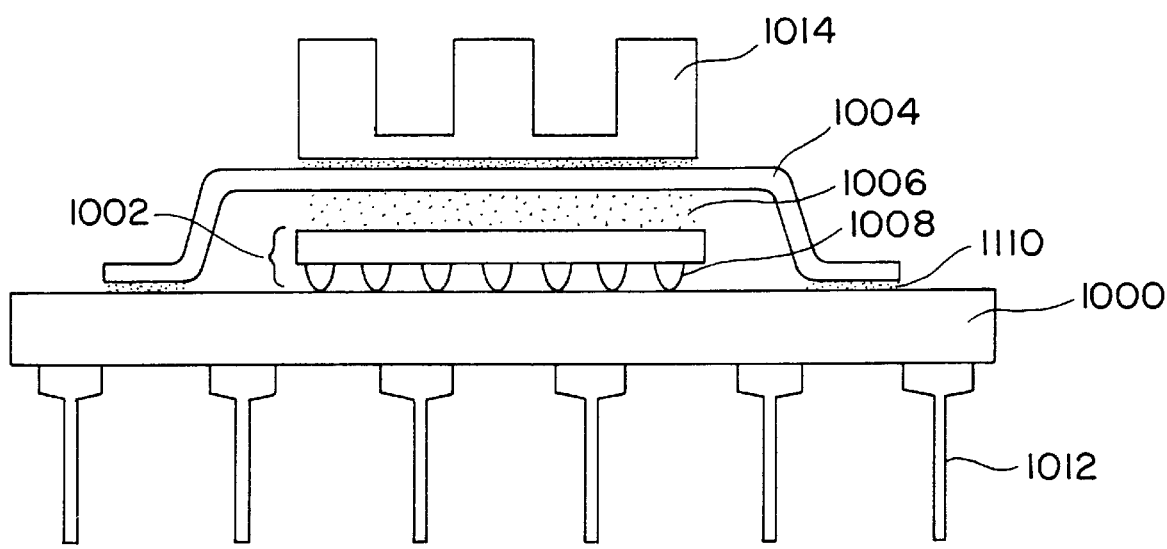
FIG. 10 is a partial side view of a prior art integrated circuit chip heat dissipation system.

Referring to FIG. 8, a sixth exemplary embodiment of the present invention is shown. In FIG. 8, heatsink 802 is attached to the top of lid 104. In this way, more effective heat dissipation of the heat generated by integrated circuit chip 102 is achieved. Heatsink 802 may be made from a metal, such as aluminum or any other material which dissipates heat. Heatsink 802 may be attached to lid 104 by brazing, soldering, clips, swaging, rivets, adhesive, and the like. Furthermore, heatsink 802 may be fabricated as part of lid 104. This embodiment, as well as any other embodiment, may be combined with any or all of the aforementioned embodiments.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An apparatus for hermetically sealing an integrated circuit, having a top surface and a bottom surface, the apparatus comprising:

a carrier substrate having a first surface and a second surface;

first attaching means for attaching the bottom surface of the integrated circuit to the first surface of the carrier substrate, an interface coolant disposed upon and in contact with the top surface of the integrated circuit, a lid disposed above the integrated circuit and in contact with the interface coolant, second attaching means for attaching the lid to the first surface of the carrier substrate with a hermetic seal, and a standoff disposed adjacent the integrated circuit and between the carrier substrate and the lid and fixedly attached to only the first surface is of the carrier substrate, the standoff supporting the lid above the carrier substrate, wherein the integrated circuit is hermetically sealed between the substrate and the lid.

2. The apparatus of claim 1, for use with a circuit board, said apparatus further comprising one of a ball grid array and a column grid array for mounting the carrier substrate to the circuit board.

3. The apparatus of claim 1, wherein the integrated circuit is a flip chip and the first attaching means is a flip chip connection.

4. The apparatus of claim 3, where the lid has an outside surface, the apparatus further comprising a heatsink attached to the outside surface of the lid.

5. The apparatus of claim 1, wherein the lid has an inside surface and an outside surface, the inside surface contacting the interface coolant.

6. The apparatus of claim 1, wherein the lid is metal.

7. The apparatus of claim 1, wherein the lid is made of a material including iron, cobalt and nickel.

8. The apparatus of claim 7, wherein the lid has a thickness in the range of 0.127 mm to 0.508 mm.

9. The apparatus of claim 1, wherein the interface coolant is a thermal paste.

10. The apparatus of claim 9, wherein the thermal paste has a thickness in the range of 0.076 mm to 0.381 mm.

11. The apparatus of claim 1, wherein the carrier substrate is ceramic.

12. The apparatus of claim 1, wherein the second attaching means is a seam seal.

13. The apparatus of claim 12, wherein the lid has an edge and the lid is brazed to the carrier substrate along the edge of the lid.

14. The apparatus of claim 1, wherein the standoff is disposed around the integrated circuit.

15. A method for hermetically sealing an integrated circuit comprising the steps of:

(a) attaching a bottom surface of the integrated circuit to a first surface of a carrier substrate, (b) placing a interface coolant in contact with a top surface of the integrated circuit, (c) disposing a lid above the integrated circuit and in contact with the interface coolant, (d) attaching the lid to the first surface of the carrier substrate, (e) supporting the lid above the carrier substrate with a standoff adjacent the integrated circuit and between the carrier substrate and the lid and fixedly attached to only the first surface of the carrier substrate, and (f) hermetically sealing the integrated circuit between the carrier substrate and the lid.

16. The method according to claim 15, wherein the attaching step (d) is brazing the lid to the carrier substrate.

17. The method according to claim 15, for use with a circuit board and further comprising the step of:

(f) coupling the carrier substrate to the circuit board.

18. The method according to claim 17, wherein the coupling step (f) is one of a ceramic ball grid array (CBGA) and a ceramic column grid array (CCGA).

19. An apparatus for hermetically sealing a flip chip, having a top surface and a bottom surface, the apparatus comprising:

a carrier substrate having a first surface and a second surface;

a flip chip connection to attach the bottom surface of the flip chip to the first surface of the carrier substrate, an interface coolant disposed upon and in contact with the top surface of the flip chip, a lid disposed above the flip chip and in contact with the interface coolant, attaching means for attaching the lid to the first surface of the carrier substrate with a hermetic seal, and a standoff disposed adjacent the flip chip and between the carrier substrate and the lid and fixedly attached to only the first surface of the carrier substrate, the standoff supporting the lid above the carrier substrate, wherein the integrated circuit is hermetically sealed between the substrate and the lid.

* * * * *